United States Patent [19]

Knauer

[11] 4,255,673
[45] Mar. 10, 1981

[54] INPUT CHARGE CORRECTED MONOLITHICALLY INTEGRATED CHARGE TRANSFER DEVICE (CTD) ARRANGEMENT

[75] Inventor: Karl Knauer, Kirchseeon, Fed. Rep. of Germany

[73] Assignee: Siemens Aktiengesellschaft, Berlin & Munich, Fed. Rep. of Germany

[21] Appl. No.: 63,929

[22] Filed: Aug. 6, 1979

[30] Foreign Application Priority Data

Aug. 31, 1978 [DE] Fed. Rep. of Germany ....... 2838037

[51] Int. Cl.³ .................. G11C 19/28; H01L 29/78; H03H 15/02
[52] U.S. Cl. .............................. 307/221 D; 357/24; 333/165
[58] Field of Search ............... 357/24; 307/221 D; 333/165

[56] References Cited

U.S. PATENT DOCUMENTS

| 3,937,985 | 2/1976 | Cooper | 357/24 |
| 3,969,634 | 7/1976 | Su et al. | 357/24 |

Primary Examiner—Gene M. Munson
Attorney, Agent, or Firm—Hill, Van Santen, Steadman, Chiara & Simpson

[57] ABSTRACT

The invention relates to a CTD arrangement comprising an input stage (ETS) which increases each of the input, signal-dependent charge quantities by basic charges (fat zero). In arrangements of this kind, it is endeavored to eliminate the influence of fluctuations in operating voltages upon the d.c. voltage component or d.c. component of the output signal. The invention solves this problem in that a compensation stage (KST) which fully eliminates the added basic charges is inserted into the CTD channel. The sphere of application for the invention includes CTD circuits, and in particular CTD transversal filter circuits.

5 Claims, 6 Drawing Figures

INPUT CHARGE CORRECTED MONOLITHICALLY INTEGRATED CHARGE TRANSFER DEVICE (CTD) ARRANGEMENT

BACKGROUND OF THE INVENTION

The invention relates to a monolithically integrated CCD arrangement.

In CCD arrangements of this type which are used to transmit or process, e.g., filter, analog signals, disturbances occur in the transmission or processing functions which are due for example to incomplete transmission of the individual, signal-dependent charge quantities between the potential drains which are adjacent to one another. Inasmuch as it is brought about by recharging processes at the boundary surface between the semiconductor layer and the covering insulating layer, this fault influence is countered in a known manner in that the individual, signal-dependent charge quantities are each increased by an additional, constant fundamental charge, which is also referred to as "fat zero" in the English language. However, a disadvantage consists in the fact that the size of the individual basic charges is dependent upon fluctuations in the supply voltages which leads to the d.c. voltage or d.c. component of the output signal also being influenced by these fluctuations.

SUMMARY OF THE INVENTION

The object of the present invention is to reduce the dependence of the output signal upon fluctuations in the supply voltages.

The advantage which may be achieved by means of the present invention consists in particular in the fact that a very substantial compensation of the influence of fluctuations in the supply voltages upon the d.c. voltage component or d.c. component of the output signal is attained. The reason for this is that the same value which, by virtue of its fluctuation, results in a change in the basic charge, is employed in the compensation stage in order to compensate the change in basic charge. In particular, in CCD arrangements which possess a plurality of input stages such as, for example, as transversal filters, it is possible to eliminate those dependences of the output signal upon supply voltages, which derive from all the input stages which evaluate the input signal in accordance with the same sign, by means of one single compensation stage commonly assigned to these stages.

BRIEF DESCRIPTION OF THE DRAWINGS

In the following, the invention will be explained in detail, making reference to the drawing, in which.

DESCRIPTION OF THE PREFERRED EMBODIMENTS

Figure 1:
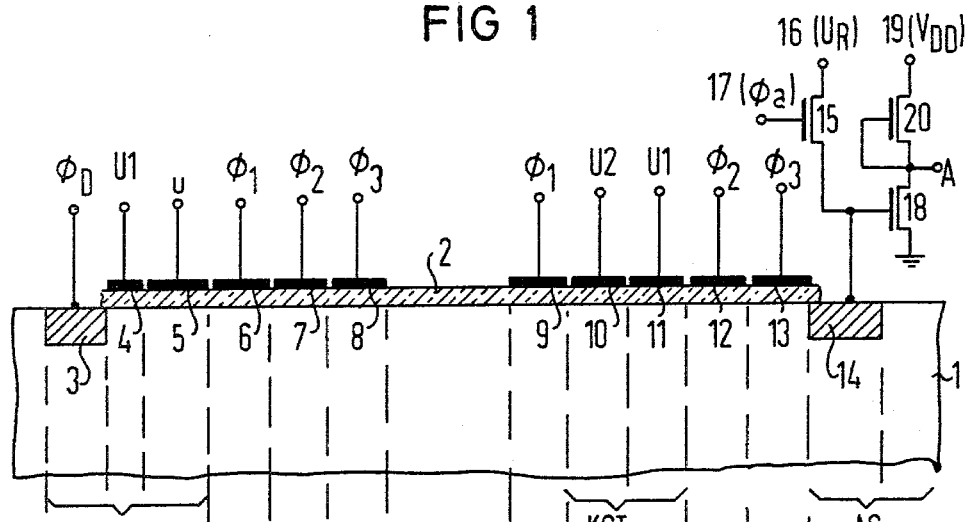
FIG. 1 is a partial cross-section through a charge coupled arrangement corresponding to the invention, comprising an input stage which positively evaluates the input signal and an assigned compensation stage.

FIG. 1 illustrates a charge transfer device (CTD) in the form of a charge coupled device (CCD) which is arranged in or on a semiconductor layer 1 composed of doped semiconductor material of a given conductivity type, e.g., p-conducting silicon. Here, the semiconductor layer 1 can consist of an epitaxial layer which has been grown on a semiconductor substrate or a carrier body composed of electrically insulating material, or can be regarded as part of a thicker semiconductor substrate which then itself forms the carrier body. The semiconductor layer 1 is covered by a thin, electrically insulating layer 2 which consists, for example, of $SiO_2$. 3 designates a zone of the opposite conductivity type, thus in the described example, an n-conducting zone, which is produced by redoping the semiconductor layer 1 by diffusion or implantation of disturbance center atoms.

Arranged on the insulating layer 2 are a series of juxtaposed electrodes 4 to 13 which consist of electrically conductive coatings, e.g., a metal in particular Al or a highly doped, polycrystalline silicon. The electrodes 4 and 5 each represent a first input gate and a second input gate which are connected via their illustrated terminals to a constant d.c. voltage $U_1$ and an analog input signal u. The zone 3 is fed with a pulse train voltage $\phi_D$ via its illustrated terminal. Here the components 3 to 5 form the input stage ES of the CCD arrangement.

The input stage ES is adjoined by the electrodes 6 to 13, of which the electrodes 6 to 9, 12 and 13 have been designated transfer electrodes. In the illustrated case of a three-phase arrangement, three successive transfer electrodes have in each case been combined to form one stage and connected via their terminals to in each case, one of three transfer pulse train voltages $\phi_1$, $\phi_2$ and $\phi_3$, which are displaced in phase relative to one another. The transfer electrodes 9, 12 and 13 form part of the last stage of the CCD arrangement. Between the electrodes 9 and 12, there is arranged a compensation stage KST, which comprises a first compensation gate 10 and a second compensation gate 11 arranged beside one another.

Beside the electrode 13, there is arranged an output stage AS which is known per se, and which in the present example, comprises a diffusion zone 14 having a conductivity type which is opposite to that of 1. The diffusion zone 14 leads via the source-drain path of a field effect transistor 15 to a terminal 16 which is connected to a reference voltage $U_R$. The gate of 15 is connected to a terminal 17, which is connected to a pulse train voltage $\phi_a$. In addition, the zone 14 is connected to the gate of a field effect transistor 18, whose source-drain path lies in a circuit which on the one hand leads to a terminal 19 which supplies the supply voltage $V_{DD}$, and, on the other hand, leads to ground potential. Between the drain terminal of the field effect transistor 18 and the circuit point 19, there is arranged a load element 20, which, for example, consists of a field effect transistor whose gate is connected to its source terminal. The connection point between the drain terminal of the field effect transistor 18 and the load element 20 simultaneously represents the output A of the CCD arrangement, whereas the circuit components 18 and 20 form an inverter stage.

As already described, in the arrangement illustrated in FIG. 1, the first input gate 4 is supplied with a constant d.c. voltage $U_1$, whereas the second input gate 5 is supplied with the analog input signal u. The first compensation gate 10 is then connected to a compensation d.c. voltage $U_2$, which is dependent upon the input signal u, whereas the second compensation gate is connected to the constant d.c. voltage $U_1$.

Figure 2:
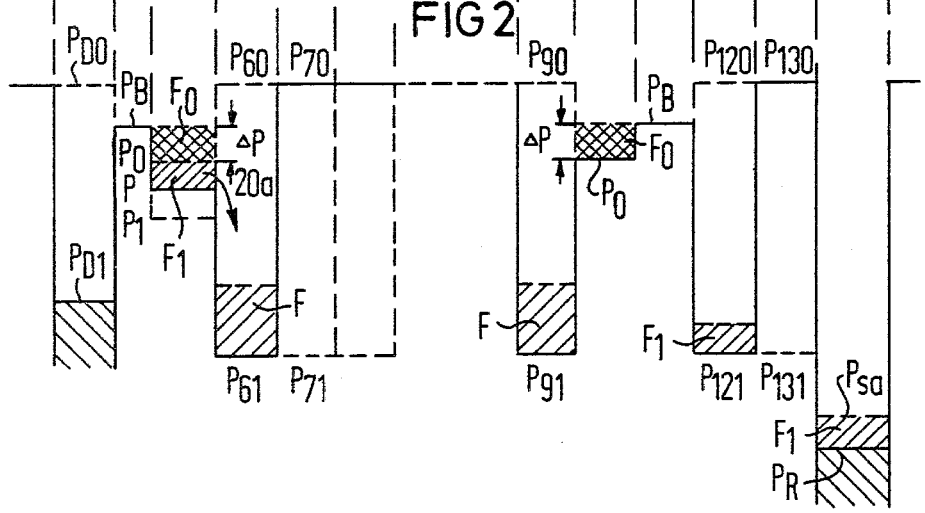
FIG. 2 illustrates the curve of the surface potential in the arrangement shown in FIG. 1.
Figure 3:
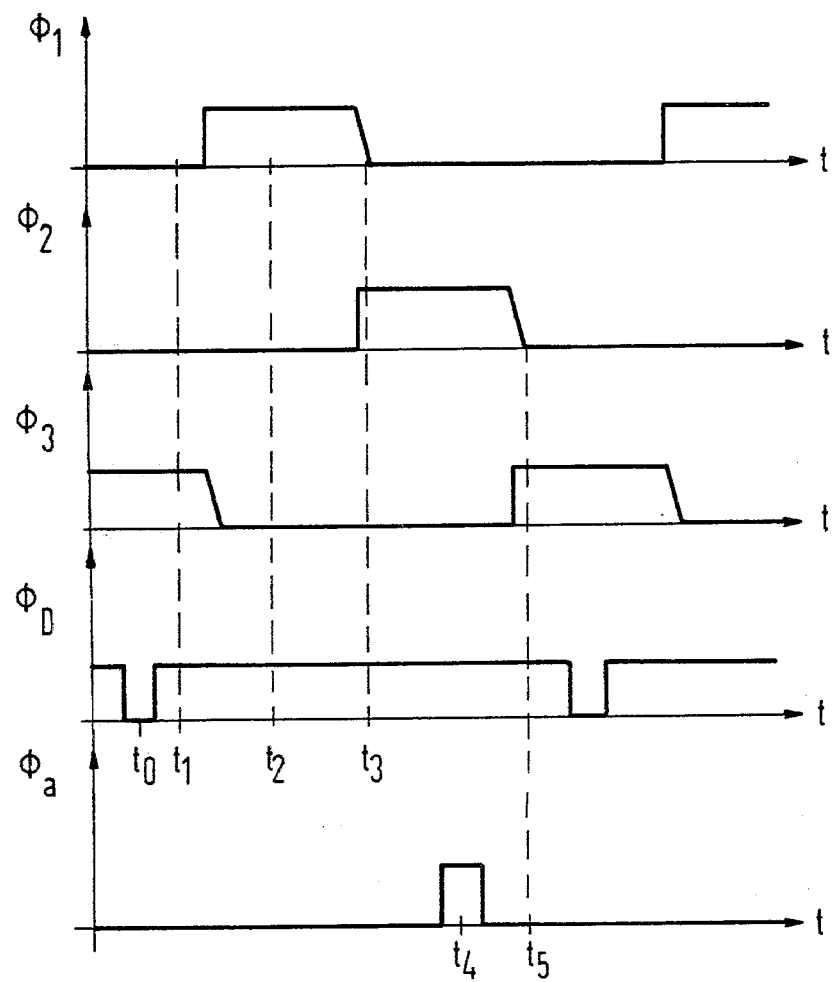
FIG. 3 illustrates voltage-time diagrams relating to FIG. 1.

The mode of operation of the circuit illustrated in FIG. 1 will be explained in detail in the following, making reference to the curve of the surface potential $\phi_s$ of the semiconductor layer 1 beneath the electrodes 4 to 13, and in the region of the zones 3 and 14, as illustrated in FIG. 2, and making refernce to the voltage-time diagrams shown in FIG. 3. The influence of the pulse train voltage $\phi_D$ produces potential values $P_{D1}$ and $P_{D0}$ on the surface of the doped zone 3. Values of the surface potential $\phi_s$ lying between $P_0$ (for the minimum input signal $u_{min}$) and $P_1$ (for the maximum input signal $u_{max}$) occur beneath the input gate 5. The constant d.c. voltage $U_1$ causes a constant potential threshold $P_B$ to form beneath the first input gate 4. Here $U_1$ is reduced relative to the minimum input signal $u_{min}$ by a given quantity corresponding to the potential difference $\Delta P = P_0 - P_B$. When the transfer pulse train voltages $\phi_1$, $\phi_2$ and $\phi_3$ are connected potential values $P_{61}$, $P_{71}$, ... $P_{131}$, occur beneath the individual transfer electrodes 6 to 9, 12 and 13, whereas when these voltages are disconnected the values $P_{60}$, $P_{70}$ ... $P_{130}$ occur. Immediately prior to the read-out of each individual charge quantity by means of a timing pulse $\phi_a$, the zone 14 is connected via the transistor 15 to the reference potential $U_R$ which is connected at 16, setting up a potential value $P_R$. At the end of the timing pulse $\phi_a$, the zone 14 has been freed of external potentials.

At the time $t_0$ (FIG. 3), a potential curve $P_{D0}$, $P_B$, $P_{60}$, $P_{70}$, etc. exists where P signifies a potential value which occurs beneath the input gate 5 under the influence of the particular value of the input signal u. In the case of this potential curve the potential well formed beneath 5 is flooded with charge carriers from the zone 3. At the time $t_1$, $P_{D0}$ has become $P_{D1}$, and the charge carriers have returned from the aforementioned potential well into the zone 3 to such an extent that the potential well only remains full up to the boundary referenced $P_B$, which has been indicated in FIG. 2 by the single shaded and double shaded areas $F_1$ and $F_0$. Here $F_1$ represents a gauge of the signal-dependent part of the quantity of charge which has accumulated beneath the input electrode 5, whereas $F_0$ is a gauge of a signal-independent part of this charge quantity which is also referred to as basic charge. At the time $t_2$, $P_{60}$ has become $P_{61}$, and the quantity of charge represented by $F = F_0 + F_1$ has been transferred beneath the electrode 6 in accordance with the arrow 20a.

In the arrangement illustrated in FIG. 1, on the occurrence of the minimum input signal $u_{min}$, because of $P = P_0$, the minimum charge quantity which corresponds to the basic charge represented by $F_0$ is input beneath the electrode 6. On the occurrence of the maximum input signal $u_{max}$, on account of $P = P_1$, the maximum charge quantity moves beneath the first electrode 6. This corresponds to a positive evaluation of the input signal u by the input stage ES. The input procedure is repeated with the frequency of one of the transfer pulse train voltages $\phi_1$ to $\phi_3$, which is also referred to as the pulse train fequency of the CCD arrangement.

The charge quantities F which are input consecutively and which each consist of a basic charge and a signal-dependent sub-charge are transferred in stepped fashion beneath the series of transfer electrodes 6, 7, 8 ... in the direction of the output stage AS with a mutual spacing corresponding to three times the electrode spacing and within each period of the pulse train frequency they each pass through the semiconductor zone of three consecutive transfer electrodes.

A charge quantity F, which is located beneath the electrode 9 on the occurrence of the pulse train $\phi_1$, i.e., on the occurrence of the potential value $P_{91}$, is represented in FIG. 2 by a shaded area. At the same time, the surface potential $\phi_s$ possesses a value of $P_{120}$ beneath the electrode 12 and a value of $P_{130}$ beneath the electrode 13. At the time $t_3$, $P_{91}$ has become $P_{90}$, and the charge designated F is partially transferred to the potential well which is formed by the potential value $P_{121}$, and is located beneath 12. During this transfer process, however, only the signal-dependent part of the relevant charge quantity F represented by the area $F_1$ moves beneath the electrode 12. The basic charge $F_0$ remains beneath the first compensation gate 10 and fills the potential well located here, whose base is governed by $P_o$ on account of the connected compensation d.c. voltage $U_2$, which corresponds to the value of $u_{min}$, and whose boundary is governed by the potential value $P_B$ beneath the compensation gate 11. Thus, this potential well possesses a boundary height of $\Delta P$. Here, it must be ensured that the surface of the compensation gate 10 corresponds to the area of the second input gate 5.

In accordance with a further development of the invention, in the event that a compensation d.c. voltage $U_2 = u_{min}$ is not readily available, it is also possible to proceed by instead connecting a compensation d.c. voltge $U_3$ corresponding to the arithmetic mean of $u_{max}$ and $u_{min}$ to the gate 11 in which case the area of the compensation gate 11 must be simultaneously reduced by the factor $U_2/U_3$.

At the time $t_4$, the zone 14 has been set via the switching transistor 15 to the reference potential $P_R$, whereupon, at the time $t_5$, the potential value $P_{121}$ has changed to $P_{120}$, the potential value $P_{130}$ has changed to $P_{131}$, and the signal-dependent charge $F_1$ has reached the zone 14 and its potential has fallen to a signal-dependent value $P_{sa}$. As a result, the potential across the gate of the transistor 18 has also fallen, which, due to the inverting action of the amplifier stage 18, 20, leads to a rise in the voltage signal at the output A. The rise in the voltage signal at A is tapped in known manner, e.g., by a following sampling stage.

With the above described design and mode of operation of the circuit illustrated in FIG. 1, it is possible to fully compensate, in the compensation stage KST, the fluctuations in the basic charge $F_0$, which are due to fluctuations in the voltage $U_1$ and the d.c. voltage component of the input signal, as the fluctuation-dependent change in $\Delta P$ influences both the input stage ES and the compensation stage KST in the same manner.

Figure 4:
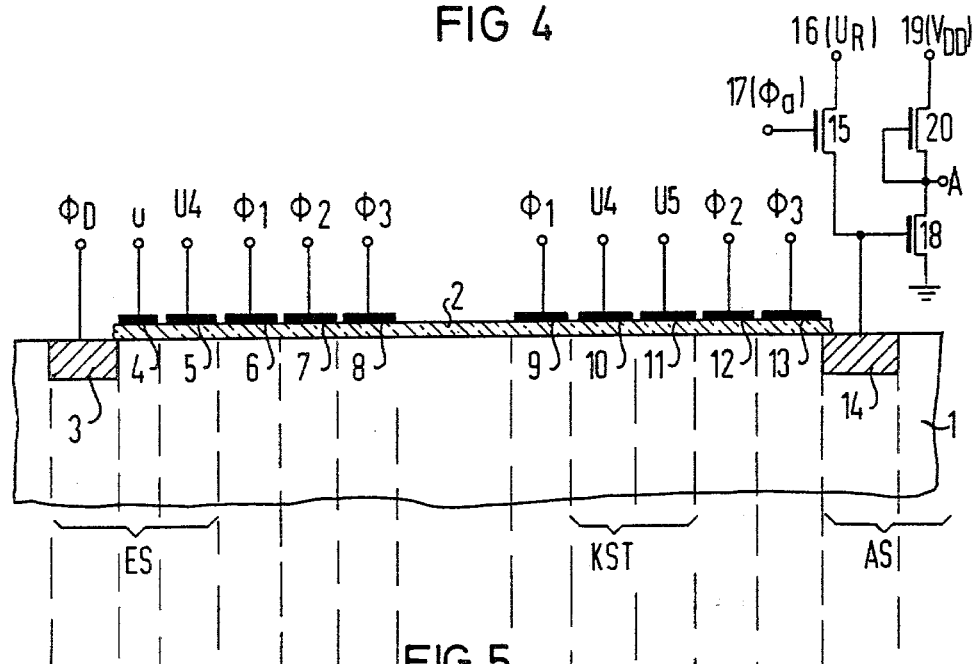
FIG. 4 is a partial cross-section through a charge coupled arrangement fundamentally corresponding to FIG. 1, comprising an input stage which negatively evaluates the input signal.

FIG. 4 illustrates another CCD arrangement, which is designed in accordance with the invention, and which corresponds in structure to the arrangement shown in FIG. 1, although in part is operated differently. Here, those circuit components which have already been described with reference to FIG. 1 have been provided with identical references. In contrast to FIG. 1, in FIG.

4, the input signal u is fed to the terminal of the first input gate 4, whereas the terminal of the second input gate 5 is connected to a constant d.c. voltage $U_4$, which exceeds the maximum value $u_{max}$ of the input signal u by a given quantity. The input stage in FIG. 4 is referenced ES'. On the other hand, the first compensation gate 10 of the compensation stage referenced KST' in FIG. 4 is supplied with the constant d.c. voltage $U_4$, whereas the second compensation gate 11 is supplied with a compensation d.c. voltge $U_5$, which corresponds to the maximum value $u_{max}$ of the input signal u.

Figure 5:
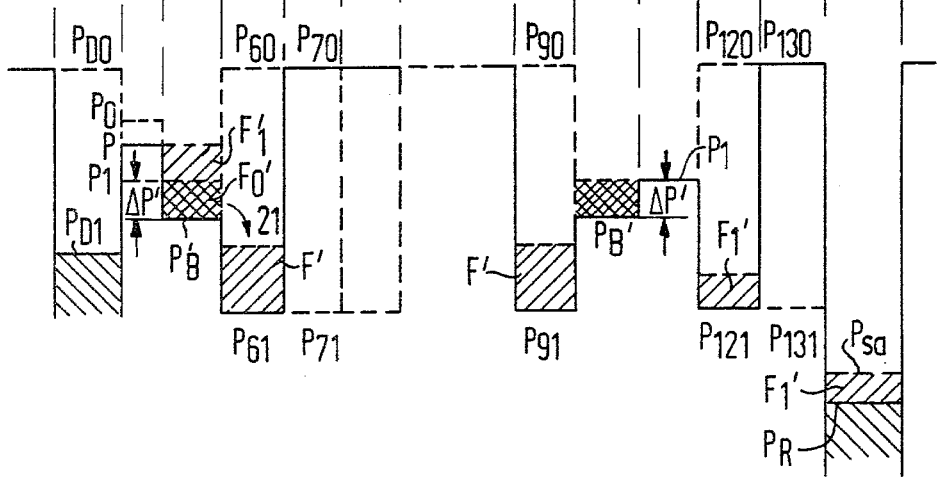
FIG. 5 illustrates the curve of the surface potential in the arrangement shown in FIG. 4.

In dependence upon the instantaneous value of the input signal u, a value P of the surface potential $\phi_s$, which lies between $P_0$ (for the minimum input signal $u_{min}$) and $P_1$ (for the maximum input signal $U_{max}$), occurs beneath the input gate 4. The constant d.c. voltage $U_4$ produces a constant potential threshold $P_{B'}$. Here, $U_4$ exceeds the maximum value $u_{max}$ by an amount corresponding to the potential difference $\Delta P' = P_B' - P_1$. Following the transition from $P_{D0}$ to $P_{D1}$, thus in the drive phase characterized by the time $t_1$ in which the potential curve $P_{D1}, P, P_B', P_{60} \ldots$ occurs, charge carriers which have previously flowed into the potential well beneath the input gate 5 now return from this potential well into the zone 3 to the extent that the potential well only remains full to the boundary represented by P. The degree of filling is indicated in FIG. 5 by the single shaded and double shaded areas $F_1'$ and $F_0'$. Here, $F_1'$ represents a gauge of the signal-dependent part of the charge quantity present beneath 5, whereas $F_0'$ represents a gauge of a signal-independent part of this charge quantity which is again referred to as the basic charge. At the time $t_2$, the potential value $P_{60}$ has changed to $P_{61}$, and the charge quantity referenced $F' = F_0' + F_1'$ has been transferred beneath the electrode 6 in accordance with the arrow 21.

In the arrangement illustrated in FIG. 4, on the occurrence of the minimum input signal $u_{min}$ on account of $P = P_0$, the maximum charge quantity is input beneath the electrode 6, whereas on the occurrence of the maximum input signal $u_{max}$ on account of $P = P_1$, the minimum charge quantity which corresponds to the basic charge $F_0'$ is input beneath the electrode 6, resulting in a negative evaluation of the input signal u by the input stage ES'. The input process which has been described with reference to FIGS. 4 and 5 is repeated in the input stage ES' with the pulse train frequency of the CCD arrangement. The input charge quantities F', which each consist of a basic charge and a signal-dependent sub-charge are transferred in steps in the direction of the output stage AS in the same way as the charge quantities F in the arrangement illustrated in FIG. 1.

A charge quantity F', which is present beneath the first electrode 9 of the last stage when a timing pulse $\phi_1$ is connected, is represented by a shaded area in FIG. 5. At this time, the surface potential $\phi_s$ possesses a value of $P_{120}$ beneath the electrode 12, and a value of $P_{130}$ beneath the electrode 13. At the time $t_3$, $P_{91}$ has become $P_{90}$ and $P_{120}$ has become $P_{121}$, and the charge referenced F' partially flows into the potential well formed by $P_{121}$. However, during this transfer process, only the signal-dependent part of the relevant charge quantity which is represented by the area $F_1'$ comes beneath the electrode 12. The basic charge $F_o'$ remains beneath the first compensation gate 10 and fills the potential well, which exists at this point and which is formed by the potential value $P_1$ and the potential value $P_B'$ beneath the gate 10. In order to ensure that only the basic charge $F_0'$ is retained in this portenital well, the area of the compensation gate 10 must correspond to that of the second input gate 5.

In accordance with a further development of the arrangement illustrated in FIG. 4, in place of the compensation d.c. voltage $U_5$, a compensation d.c. voltage herein referred to as $U_6$, corresponding to the arithmetic mean of $u_{max}$ and $u_{min}$ can be fed to the compensation gate 11 if the area of the compensation gate 10 is simultaneously reduced by the factor $U_6/U_5$.

If the arrangement illustrated in FIG. 4 is designed and operated in the described manner, the fluctuations in the basic charge $F_0'$, which are due to fluctuations in the voltage $U_4$ and in the d.c. voltage component of the input signal u, are fully compensated in the compensation stage KST', since the value P', which influences the value of the basic charge $F_0'$ is equal in size both in the input stage ES' and in the compensation stage KST', irrespectively of the aforementioned fluctuations.

Figure 6:
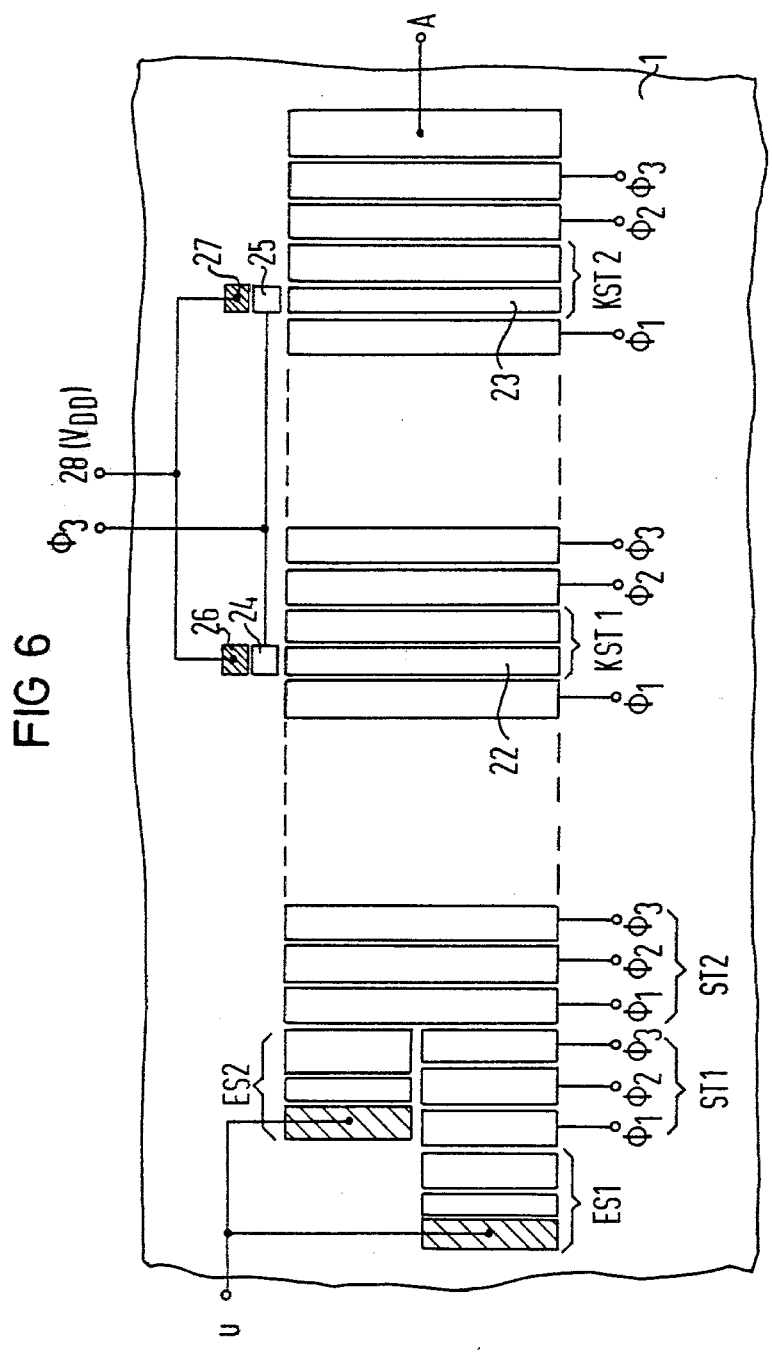
FIG. 6 is a plan view of a charge coupled arrangement corresponding to the invention comprising two parallel inputs which evaluate the input signal with different signs.

The elimination of the basic charge $F_0, F_0'$, which is retained beneath the compensation gate 11 in FIG. 1 and FIG. 4, respectively, will be explained making reference to FIG. 6. FIG. 6 is a plan view of a CCD arrangement which is constructed in accordance with FIG. 1 and FIG. 4, and which comprises two parallel input stages $ES_1$ and $ES_2$, the first of which ensures that charge quantities F which occur periodically in the case of a positive evaluation of the input signal u in accordance with FIG. 1, are input into the first stage $ST_1$ of the CCD arrangement, and the second of which ($ES_2$) ensures that the charge quantities F', which occur periodically in the case of a negative evaluation of the input signal illustrated in FIG. 4, are input into the second stage $ST_2$. Sum signals which are formed from the individual signals evaluated via the two input stages by an addition of the signal-dependent charge components are then tapped from the output A of the schematically illustrated output stage AS. The basic charges $F_0$, which have been input via $ES_1$ are retained beneath the compensation gate 22 in a compensation stage KST1 which operates in accordance with the stage KST in FIG. 1, and the basic charges $F_0'$ which have been input via the input stage ES2 are retained beneath the compensation gate 23 in a compensation stage KST2, which operates in accordance with the stage KST' in FIG. 4. For the discharge of the retained basic charges, transfer gate electrodes 24 and 25 are provided, which, when the timing pulses of $\phi_3$ are connected, conductively connect the semiconductor zones located beneath the electrodes 22 and 23 to zones 26 and 27, which are oppositely doped to the semiconductor layer 1. As a result, the basic charges $F_0$ and $F_0'$ localized beneath the electrodes 22 and 23 are discharged into these zones which are connected via a terminal 28 to the potential of the supply voltage $V_{DD}$.

If a plurality of input stages ES1 are provided, each of which carry out a positive signal evaluation, it is adequate to provide one compensation stage KST1 to compensate all the basic charges input by the input stages, provided the area of the compensation gate 22 is selected to be sufficiently large to correspond to the sum of the areas of those input gate electrodes of all the input stages which are closer to the output stage AS. The same applies in the case of a plurality of input stages ES2, in which case the area of the compensation gate 23 is increased accordingly.

Each of the compensation stages KST1, KST2 can generally be provided between two arbitrary transfer electrodes of the CCD arrangement, and in FIG. 6 also, for example, between the transfer electrodes connected to $\phi_2$ and $\phi_3$, in which case, it is expedient to eliminate the basic charges by means of the timing pulses of $\phi_1$.

Arrangements corresponding to FIG. 6 are used for example, in CTD transversal filters in which a signal u, which is to be filtered is fed in parallel to a CTD arrangement via a plurality of input stages, e.g., ES1, ES2, etc., whereas the filtered signal is tapped in serial fashion from a CTD output, e.g., A.

Although the exemplary embodiments of the invention, which have been described and represented above, are based on a CCD arrangement in which the charges are transferred on the surface of the semiconductor layer 1, the invention can also be applied in CCD arrangements in which the charge transport takes place inside the semiconductor layer 1, and which are commonly designated BCCD arrangements. Furthermore, the invention can be used in all arrangements known per se and referred to as CTD arrangements, such as described, for example, in the book by Sequin and Tompsett "Charge Transfer Devices", Academic Press, New York, 1975, on pages 1 to 18. In dependence upon their structure, these CTD arrangements can operate in two-phase, three-phase, four-phase, or multi-phase fashion.

It will be apparent to those skilled in the art that many modifications and variations may be effected without departing from the spirit and scope of the novel concepts of the present invention.

I claim as my invention:

1. A monolithically integrated CTD arrangement, comprising a semiconductor layer formed with a first conductivity type of doping, first and second spaced apart zones formed in said doped semiconductor layer with a second conductivity type of doping, and input stage which comprises said first zone and a first input gate electrode and a second input gate electrode, each of said gate electrodes being arranged in an insulated fashion above said semiconductor layer, one of said input gate electrodes being fed with an analog input signal, the other of said input gate electrodes being fed with a constant d.c. voltage, and said zone being fed with a pulse train voltage, a series of transfer electrodes arranged in an insulated fashion above said semiconductor layer and an output stage which includes said second zone, the constant d.c. voltage differing from one of the extreme values of the input signal by an amount which corresponds to a basic charge which is to be input, a compensation stage being provided which is located within said series of transfer electrodes and which possesses two compensation gate electrodes which are arranged in insulated fashion above said semiconductor layer, one of which said compensation electrodes being fed with a compensation d.c. voltage which is dependent upon the analog input signal and the other of which is fed with the said constant d.c. voltage, one of said transfer electrodes being arranged adjacent said second zone, and said second zone is provided with a drain terminal.

2. A CTD arrangement as claimed in claim 1, in which said compensation d.c. voltage corresponds to said extreme value of said input signal, and wherein said compensation gate electrode which is further removed from said output stage has an area which corresponds to the area of said input gate electrode which is closer to said output stage.

3. A CTD arrangement as claimed in claim 1, in which said compensation d.c. voltage corresponds to the arithmetic mean of said input signal, and wherein said compensation gate electrode which is further removed from said output stage has an area which is reduced in comparison to the area of said input gate electrode which is closer to said output stage by a factor which corresponds to the quotient which is formed from the said extreme value and the arithmetic mean value and which is lower than 1.

4. A CTD arrangement as claimed in claim 1 including a plurality of input stages each of which evaluates an input signal with the same sign, each said input stage has two input gate electrodes, and wherein said compensation gate electrode which is further removed from said output stage has an area which corresponds to the sum of the areas of all said input gate electrodes of all of said input stages which are closer to said output stage.

5. A CTD arrangement as claimed in claim 1 including a plurality of input stages a first portion of which evaluate the input signal with a first signal and a second portion of which evaluate the input signal with an opposite sign, each said input stage has first and second electrodes and a second compensation stage with two compensation gate electrodes with a said compensation gate electrode, which is further removed from said output stage, of said first compensation stage possessing an area which corresponds to a sum of areas of each of said input gate electrodes, which are each closer to said output stage, of all of said first portion of input stages which evaluate the input signal in accordance with a first sign, and that a said compensation gate electrode, which is further removed from said output stage, of said other compensation stage possessing an area which corresponds to a sum of areas of each of said input gate electrodes, which are each closer to said output stage, of all of said second portion of input stages which evaluate the input signal in accordance with the other sign.

* * * * *